United States Patent [19]

White et al.

[11] Patent Number: 4,980,573
[45] Date of Patent: Dec. 25, 1990

[54] FIRING CIRCUIT WITH THREE CRASH SENSORS

[75] Inventors: Craig W. White, Grosse Pointe; Kevin E. Messer, Farmington, both of Mich.

[73] Assignee: Automotive Systems Laboratory, Inc., Farmington Hills, Mich.

[21] Appl. No.: 413,869

[22] Filed: Oct. 2, 1989

[51] Int. Cl.⁵ .............................................. B60R 21/32
[52] U.S. Cl. .................................. 307/10.1; 180/282; 280/735
[58] Field of Search ...................... 307/9.1, 10.1, 10 R, 307/139; 340/436, 437; 180/271, 282; 280/734, 735, 727, 728

[56] References Cited

U.S. PATENT DOCUMENTS

| | | | |
|---|---|---|---|
| 3,871,472 | 3/1975 | Hosaka et al. | 280/735 |
| 4,359,715 | 11/1982 | Langer et al. | 280/735 |
| 4,381,829 | 5/1983 | Montaron | 180/282 |
| 4,804,859 | 2/1989 | Swart | 307/10.1 |
| 4,851,705 | 7/1989 | Musser et al. | 280/735 |
| 4,893,109 | 1/1990 | Vrabel et al. | 307/10.1 |
| 4,933,570 | 6/1990 | Swart et al. | 307/10.1 |

Primary Examiner—A. D. Pellinen
Assistant Examiner—Richard Elms
Attorney, Agent, or Firm—Lyon & Delevie

[57] ABSTRACT

A firing circuit for deploying a pair of air bags comprises two circuit legs connected in parallel across a voltage supply. Each circuit leg comprises in series a safing sensor, a squib, and a crash sensor, with each sensor being shunted by a like resistor having a nominal resistance substantially greater than the nominal resistance of the squibs. A first diode bridge comprising a pair of oppositely-biased diodes extends between a first pair of junctions on the circuit legs located between the safing sensors and the squibs thereof. A second diode bridge comprising a pair of oppositely-biased diodes extends between a second pair of junctions on the circuit legs located between the squibs and the crash sensors thereof. A third diode bridge comprising oppositely-biased diodes connected in series also extends between the latter pair of junctions on the circuit legs. A third crash sensor connects a junction on the third diode bridge between the diodes thereof with both circuit legs, respectively, so as to be placed in parallel with the crash sensors thereof. The diode bridges provide multiple firing paths for both squibs to ensure deployment of both air bags upon simultaneous closure of either safing sensor and any crash sensor. Full circuit diagnosability is achieved through a comparison of the voltages achieved about the circuit and the effects thereon of incrementing the supply voltage and/or the operation of a plurality of current drains connected about the circuit.

10 Claims, 3 Drawing Sheets

_4,980,573_

FIRING CIRCUIT WITH THREE CRASH SENSORS

BACKGROUND OF THE INVENTION

The instant invention relates to vehicle passenger restraint systems and, more specifically, to a firing circuit for an air bag passive restraint system which can be readily diagnosed for the presence of faults therein.

Known air bag passenger restraint systems comprise a firing circuit having a voltage supply providing a potential across a firing squib in series with a first and second normally open vehicle acceleration sensor, each of which is shunted by a resistor of like nominal resistance. A small current thus flows through the circuit while the sensors remain in the normally open condition. The closure of the sensors upon collision or marked deceleration of the vehicle generates a significant rise in the current flowing through the squib which, in turn, fires the squib to deploy the air bag.

In U.S. Pat. No. 4,851,705 issued July 25, 1989, we teach a firing circuit for a passenger restraint system featuring redundant "crash" and "safing" sensors and full fault diagnosability, and its teachings are hereby incorporated herein by reference. Specifically, the '705 patent teaches a firing circuit wherein the simultaneous closure of either of two crash sensors and either of two safing sensors will fire one or more squibs to deploy a like number of air bags. The marketplace has since demanded a firing circuit for a vehicle passenger restraint system featuring a third crash or "discriminating" sensor in addition to the multiple firing paths and full fault diagnosability as taught in the '705 patent.

SUMMARY OF THE INVENTION

It is an object of the instant invention to provide a firing circuit for a vehicle passenger restraint system having three crash sensors and multiple firing paths while employing a minimum number of circuit elements.

Another object of the instant invention is to provide a firing circuit for a vehicle passenger restraint system, the elements of which may be diagnosed without necessitating the disassembly of the firing circuit.

A further object of the instant invention is to provide a method for specifically diagnosing any fault present in the instant firing circuit which does not require the disassembly thereof.

The improved firing circuit of the instant invention for actuating a first and second vehicle passenger restraint, e.g., for deploying a pair of air bags, comprises a first and second circuit leg connected in parallel across a voltage supply, whereby a first voltage is applied thereacross. Specifically, the first circuit leg comprises in series a first normally-open acceleration sensor for detecting a first condition requiring deployment of the air bags (hereinafter "safing sensor"), a first trigger means such as a squib having an internal resistance for deploying the first air bag, and a second normally-open sensor for detecting a second condition requiring deployment of the air bags (hereinafter "crash sensor"). Similarly, the second circuit leg comprises in series another safing sensor, a second squib for deploying the second air bag, and another crash sensor. The internal resistance of the second squib is substantially equal to the internal resistance of the first squib. Each of the normally-open safing and crash sensors are shunted by a resistor having a nominal resistance substantially greater than the internal resistance of each squib.

A first diode bridge comprising a pair of oppositely-biased diodes connects a first junction on the first circuit leg located between the safing sensor and the squib thereof with a first junction on the second circuit leg located between the safing sensor and squib thereof. Similarly, a second diode bridge comprising a pair of oppositely-biased diodes connects a second junction on the first circuit leg located between the squib and crash sensor thereof with a second junction on the second circuit leg located between the squib and crash sensor thereof.

A third diode bridge connects a third junction on the first circuit leg located between the squib and the crash sensor thereof with a third junction on the second circuit leg located between the squib and crash sensor thereof. The third diode bridge itself comprises a pair of oppositely-biased diodes connected in series with the cathodes thereof in opposition.

A third crash sensor connects a junction on the third diode bridge located between the diodes thereof with the first and second circuit legs, respectively, so as to be placed in parallel with the crash sensors thereof, respectively.

The diode bridges provide multiple firing paths for the squibs, whereby both squibs are fired and, hence, both air bags are deployed, upon closure of either safing sensor and any of the three crash sensors.

The diode bridges additionally permit the diagnosing of the presence of a fault in the instant firing circuit in situ, as well as permitting the identification of the fault. To that end, the instant firing circuit further comprises means for reading the voltages at several of the junctions thereabout and the voltage applied across the circuit legs; means for comparing the voltages of the several junctions with each other; means for calculating a plurality of voltage ranges from the applied voltage and a plurality of known percentages of the applied voltage, and means for comparing the voltage at one of the junctions with the thus calculated voltage ranges; means for applying a second voltage across the circuit legs greater than the first applied voltage, i.e., for increasing the voltage applied thereacross, and means for comparing the voltage at one of the junctions upon application of the first voltage across the circuit legs with the voltage at the same junction when the second voltage is applied thereacross; and means for comparing the voltage drop across each of the diode bridges with the diode forward-biased conduction voltages.

The instant firing circuit further comprises signal means for signalling the presence of the fault, and means for recording the fault, upon the diagnosis thereof. Additionally, the instant firing circuit comprises means for determining the instantaneous forward-biased conduction voltages of the diodes comprising the diode bridges, such as means operative to draw current from at least one junction about the firing circuit and means for calculating the resultant voltage drop across each of the diode bridges, whereby the firing circuit periodically redetermines the forward-biased conduction voltage of the diodes so as to account for manufacturing tolerances as well as the effects of time and temperature thereon.

DETAILED DESCRIPTION OF THE PREFERRED EMBODIMENTS OF THE INVENTION

Figure 1:
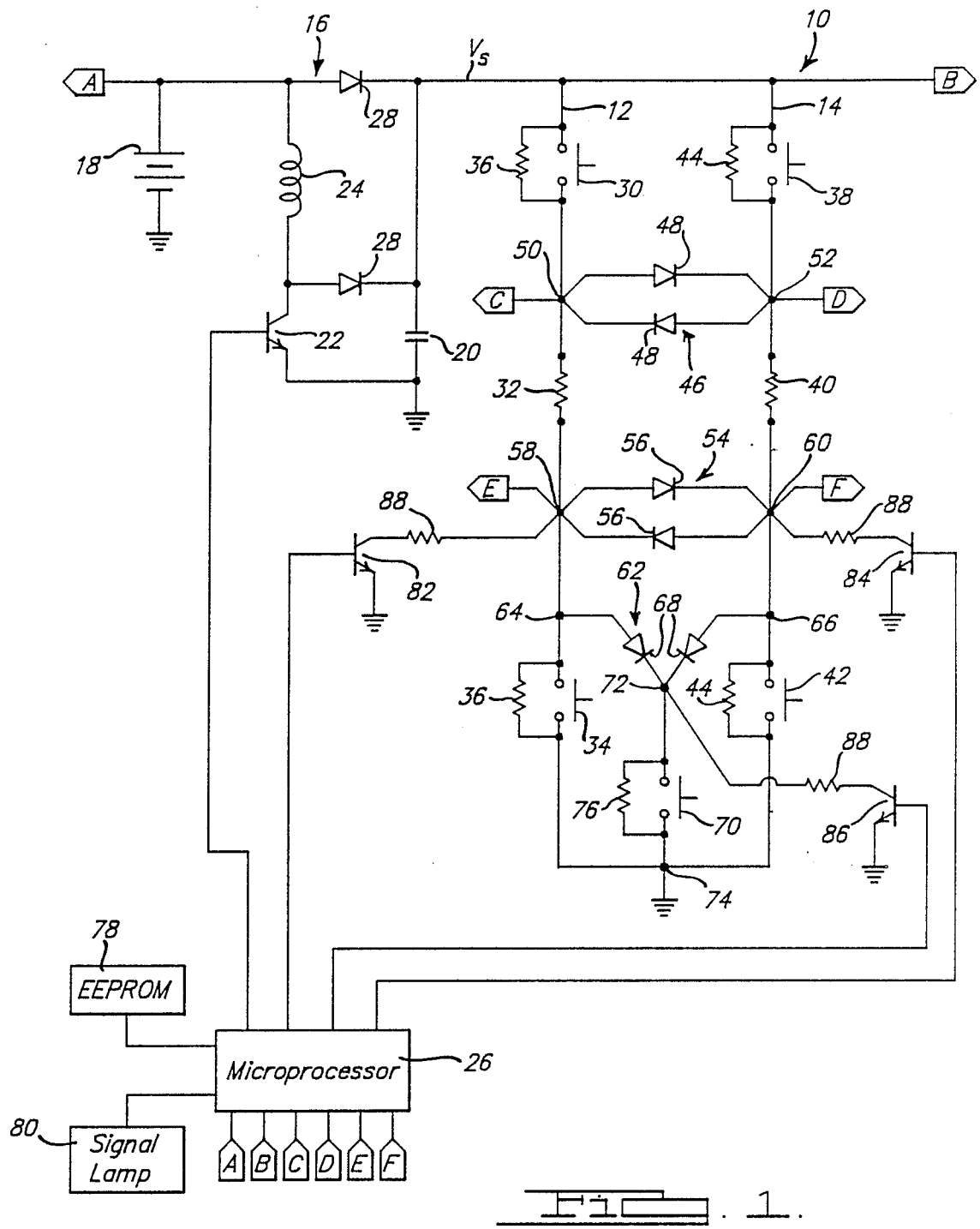
FIG. 1 is a diagrammatic schematic of an air bag firing circuit constructed in accordance with the instant invention featuring multiple firing paths and full diagnosability.

Referring to FIG. 1, a firing circuit 10 constructed in accordance with the instant invention for deploying a pair of air bags (not shown) comprises a first and second circuit leg 12 and 14 connected in parallel across a DC power supply 16. The DC power supply 16 comprises, for example, a battery 18 and a capacitor 20 connected across the battery 18 and normally charged thereby The capacitor 20 ensures that the supply voltage $V_s$ delivered across the circuit legs 12 and 14 remains sufficient to deploy the air bags in the event that the battery 18 malfunctions or is otherwise isolated from the circuit legs 12 and 14 during a vehicle collision Under the instant invention, the capacitor 20 of the power supply 16 is also charged to the nominal supply voltage $V_s$ by the pulsed output of a charging transistor 22 with the aid of an inductor 24. Specifically, a microprocessor 26 continuously monitors the battery output voltage and the supply voltage $V_s$ applied across the circuit legs 12 and 14 via a pair of analog-to-digital converter ports "A" and "B" thereon, respectively. In the event that the supply voltage $V_s$ has dropped below a voltage sufficient for deploying the air bags, the microprocessor 26 generates a pulsed output which forms the input to the charging transistor 22 which, in turn, pumps the capacitor 20 to the requisite voltage. A pair of protecting diodes 28 prevent the premature discharge of the capacitor 20.

Significantly, the pumping of the capacitor 20 further serves to momentarily increase the supply voltage $V_s$ applied across the circuit legs 12 and 14 for use in diagnosing the presence of faults therein, as described hereinbelow.

The first circuit leg 12 comprises in series a normally-open "safing" sensor 30; an explosive squib 32 for triggering deployment of the first air bag when the current flowing therethrough exceeds a threshold value; and a normally-open "crash" sensor 34. The acceleration threshold of the crash sensor 34 is significantly greater than the acceleration threshold of the safing sensor 30. Thus, as the acceleration input to the sensing elements of the firing circuit 10 is increased, the safing sensor 30 closes first to effectively "arm" the crash sensor 34; the thus armed crash sensor 34 fires the squib 32 when the acceleration input thereto increases so as to exceed the threshold thereof.

The normally-open sensors 30 and 34 of the first circuit leg 12 are each shunted by a resistor 36 of like nominal resistance. Significantly, the nominal resistance of the shunting resistors 36 is preferably several orders of magnitude larger than the nominal internal resistance of the squib 32. For example, where the nominal internal resistance of the squib 32 is about 2 ohms, the shunting resistors 36 preferably comprise 2 kΩ resistors.

Similarly, the second leg 14 of the firing circuit 10 shown in FIG. 1 comprises in series a second safing sensor 38 having a similar acceleration threshold as the safing sensor 30 of the first circuit leg 12; a second squib 40 having a similar internal resistance as that of the first squib 32 for triggering the deployment of the second air bag when the current flowing therethrough exceeds a threshold value; and a second crash sensor 42 having a similar acceleration threshold as the crash sensor 34 of the first circuit leg 12. The safing sensor 38 and the crash sensor 42 of the second circuit leg 14 are each shunted by a resistor 44 of similar nominal resistance as the shunting resistors 36 of the first circuit leg 12.

A first diode bridge 46 comprising oppositely-biased diodes 48 connects a junction 50 on the first leg 12 between the safing sensor 30 and the squib 32 thereof (hereinafter the "first junction 50") with a junction 52 on the second leg 14 between the safing sensor 38 and the squib 40 thereof (hereinafter the "second junction 52"). Similarly, a second diode bridge 54 comprising oppositely-biased diodes 56 connects another junction 58 on the first circuit leg 12 between the squib 32 and the crash sensor 34 thereof (hereinafter the "third junction 58") with another junction 60 on the second circuit leg 14 between the squib 40 and the crash sensor 42 thereof (hereinafter the "fourth junction 60").

Referring to FIG. 1, a third diode bridge 62 connects another junction 64 on the first circuit leg 12 between the squib 32 and the crash sensor 34 thereof (hereinafter the "fifth junction 64") with another junction 66 on the second circuit leg 14 between the squib 40 and the crash sensor 42 thereof (hereinafter the "sixth junction 66"). The third diode bridge 62 itself comprises a pair of oppositely-biased diodes 68 connected in series with the cathodes thereof in opposition.

A third crash sensor 70 connects a junction 72 on the third diode bridge 62 between the diodes 68 thereof (hereinafter the "seventh junction 72") with the first and second circuit legs 12 and 14, respectively, at the junction 74 therebetween (hereinafter the "eighth junction 74") so as to be placed in parallel with the first and second crash sensors 34 and 42. The third crash sensor 70 is shunted by a resistor 76 having a nominal resistance similar to that of the resistors 36 and 44 shunting the first and second crash sensors 34 and 42, respectively.

The diode bridges 46, 54, and 62 provide multiple firing paths for the squibs 32 and 40, whereby both air bags are deployed regardless of which combination of safing sensor and crash sensor closures occur. More specifically, under normal operation, the shunting resistors 36, 44, and 76 maintain a relatively low current flow through each circuit leg 12 and 14, and, hence, through the squibs 32 and 40 thereof. Upon the closure of at least one of the safing sensors 30 and 38 and at least one of the crash sensors 34, 42, and 70 due to an acceleration exceeding the threshold values thereof, the shunting resistors 36, 44, and 76 are shorted, whereby the current flowing through both squibs 32 and 40 is increased to a value above the firing threshold thereof, whereupon the air bags are simultaneously deployed.

In accordance with another feature of the instant invention, the diode bridges 46, 54, and 62 of the instant firing circuit 10 additionally permit the diagnosing of faults therein. More specifically, during normal operation, the firing circuit 10 functions as a simple parallel circuit having two legs 12 and 14 of identical resistance which, hence, draw an identical current. Therefore, during normal operation, the first and second junctions 50 and 52, and the third and fourth junctions 58, and 60, respectively, are maintained at like potentials. However, the presence of a fault within the circuit 10 disrupts the current flow through the legs 12 and 14 thereof, thereby altering the voltages at one or more of the junctions. Since each fault affects the circuit and, hence, the junction voltages in a different manner, the identity of the fault may be determined upon examination of the absolute and relative values of the voltages at the junctions 50, 52, 58, and 60.

Accordingly, the instant firing circuit 10 further comprises means for reading the voltages at each junction 50, 52, 58, and 60, such as analog-to-digital converter ports "C", "D", "E", and "F" on the microprocessor 26 which are connected thereto, respectively. The firing circuit 10 further comprises a non-volatile memory unit such as an EEPROM 78 connected with the microprocessor 26 for storing a plurality of reference values useful in diagnosing the presence of faults, and wherein the frequency and identity of such diagnosed faults are recorded for subsequent review; and signal means, such as signal lamp 80, actuated by the microprocessor 26, whereby the presence of a fault is indicated to the vehicle operator. It is noted that, where the instantaneous voltage drop across any diode bridge 46, 54, or 62 exceeds the forward-biased conduction voltage $V_d$ of the diodes 48, 56, and 68 thereof, the forwardly-biased diode of the bridge 46, 54, and 62 "turns on," i.e., a current will begin to flow therethrough, whereafter the voltage drop across the bridge 46, 54, and 62 is limited to the diode forward-biased conduction voltage $V_d$. Where the voltage across the bridge 46, 54, and 62 exceeds the forward-biased conduction voltage $V_d$ of the diodes 48, 56, and 68 thereof, a diode fault is indicated, as discussed hereinbelow.

Figure 2:
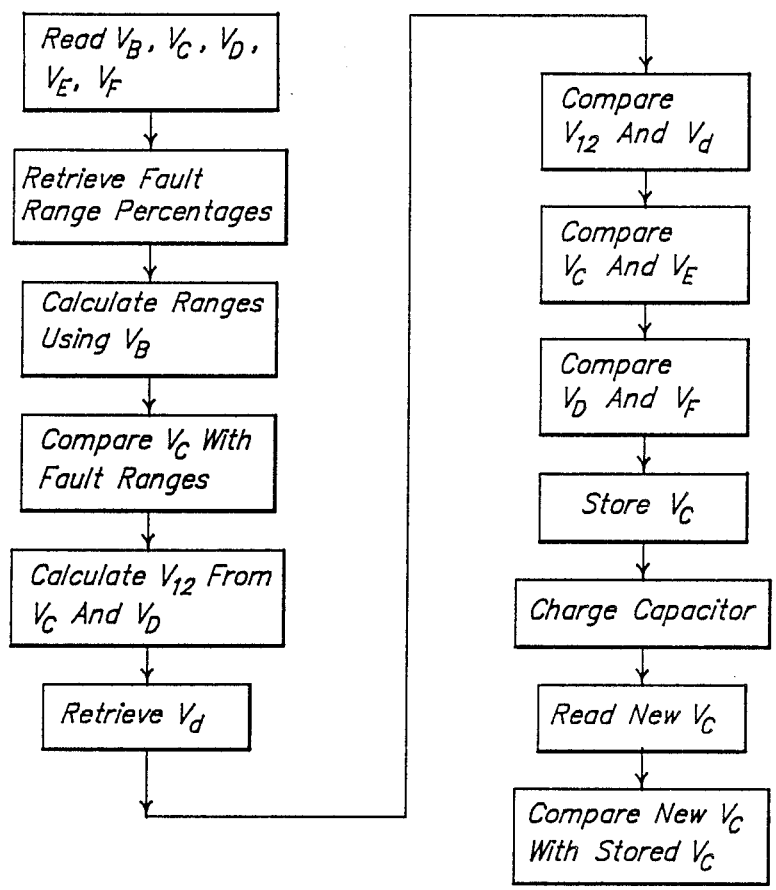
FIG. 2 is a flow chart illustrating a method for diagnosing the presence of a fault in the firing circuit of FIG. 1, as executed by the microprocessor thereof.

The diagnostic sequence executed by the microprocessor 26 is shown schematically in FIG. 2. Specifically, the microprocessor 26 diagnoses the presence, if any, of a fault in the firing circuit 10 by: (1) reading the instantaneous supply voltage $V_s$ and the voltages at the junctions 50, 52, 58, and 60 via analog-to-digital converter ports "B", "C", "D", "E", and "F" thereon, respectively; (2) retrieving from the EEPROM 78 a plurality of range percentages previously recorded therein which define ranges of junction voltages with respect to the supply voltage $V_s$ corresponding to various groupings of possible circuit faults; (3) calculating five voltage ranges using the above percentages and the instantaneous supply voltage $V_s$; and (4) determining the presence and identity of any specific fault based on: (a) the voltage range in which the voltage $V_C$ detected at the first junction 50 lies; (b) the voltage drop $V_{CD}$ between the first and second junctions 50 and 52 in comparison with a reference diode forward-biased conduction voltage $V_d$ retrieved from the EEPROM 78; (c) the voltage drops between the first and third junctions 50 and 58, and the second and fourth junctions 52 and 60, respectively; and (d) the effect that charging the capacitor 20 to a voltage higher than the instantaneous supply voltage $V_s$ used above has on the voltage $V_C$ detected at the first junction 50. If a fault is indicated, the microprocessor 26 thereafter records the indicated fault in the EEPROM 78 and empowers the signal lamp 80. It is noted that the fault range percentages may be alternately imbedded in the set of instructions to be executed by the microprocessor 26, whereby reference need no longer be made to the EEPROM 78 to obtain such values.

The fault range percentages retrieved from the EEPROM 78 in step (2) above are initially determined by circuit analysis in a manner known to those skilled in the art, whereby the likely change in voltages at the junctions 50, 52, 58 and 60, respectively, in response to each possible fault is calculated. The percentages thus obtained are then empirically broadened to provide fault voltage ranges which accommodate allowable variations in the electrical characteristics of the elements comprising the firing circuit 10. Thus, for an exemplary embodiment of the instant firing circuit 10 having 2 k shunting resistors 36, 44, and 76, Range 1 lies between ground and 14% of the supply voltage $V_s$; Range 2 between 14% and 33% of the supply voltage $V_s$; Range 3 between 33% and 44% of the supply voltage $V_s$; Range 4 between 44% and 74% of the supply voltage $V_s$; and Range 5 between 74% and 100% of the supply voltage $V_s$. Indeed, the above percentages hold true for any embodiment in which the shunting resistors 36, 44, and 76 are of like nominal resistance and the nominal internal resistance of the squibs 32 and 40 is negligible when compared therewith.

The observed voltage drops $V_{CD}$, $V_{CE}$, and $V_{DF}$ developed between the first and second junctions 54 and 56, the first and third junctions 54 and 64, and the second and fourth junctions 56 and 66, respectively, are used in combination with the above fault ranges to identify twenty-nine specific faults, or to confirm the absence of faults in the circuit 10, as indicated in the following Table:

TABLE I

|  | Fault No. | Fault Description | $V_{CD}$ | $V_{CE}$ | $V_{DF}$ | $V_C$ Upon Inc. $V_s$ |
|---|---|---|---|---|---|---|
| Range 5 | 1. | J3 short to $V_s$ | $+V_d$ | — |  |  |
|  | 2. | SS1 closed. | $+V_d$ | + |  | + |
|  | 3. | J1 short to $V_s$ | $+V_d$ | + |  | 0 |
|  | 4. | J4 short to $V_s$ | $-V_d$ |  | — |  |
|  | 5. | SS2 closed. | $-V_d$ |  | + | + |
|  | 6. | J2 short to $V_s$ | $-V_d$ |  | + | 0 |
|  | 7. | Squibs 1 & 2 open | nil | $+V_s$ |  | + |
|  | 8. | SS1&2 closed | nil | + |  | + |
|  | 9. | J1&2 short to $V_s$ | nil | + |  | 0 |
|  | 10. | Open between J3&4 and gnd. | nil | 0 |  | + |
|  | 11. | J3&4 short to $V_s$ | nil | 0 |  | 0 |
| Range 4 | 12. | Open between J3 and gnd. | $+V_d$ |  |  |  |
|  | 13. | Open between J4 and gnd. | $-V_d$ |  |  |  |

TABLE I-continued

| | | | | |
|---|---|---|---|---|
| | 14. | Measurement error | | $-V_d < V_{CD} < +V_d$ |
| | 15. | CS3 open | nil | and $V_E$ or $V_F$ changes when transistor 86 at J5 is turned on |
| | 16. | CS3 short to $V_s$ or bad diodes between either J3&5 or J4&5 | nil | and $V_E$ or $V_F$ do not change when transistor 86 at J5 is turned on |
| Range 3 | 17. | Squib 1 open | $+V_d$ | |
| | 18. | Squib 2 open | $-V_d$ | |
| | 19. | Resistor out of range | | $-V_d < V_{CD} < -g$, or $+g < V_{CD} < +V_d$ |
| | — | No fault present | nil | |
| Range 2 | 20. | Open between J1 and $V_s$ | $+V_d$ | |
| | 21. | Open between J3 and $V_s$ | $-V_d$ | |
| | 22. | Measurement error | | $-V_d < V_{CD} < +V_d$ |
| Range 1 | 23. | CS2 closed, or J4 short to gnd. | $+V_d$ | + |
| | 24. | J1 short to gnd. | $+V_d$ | 0 |
| | 25. | CS1 closed, or J2 short to gnd. | $-V_d$ | + |
| | 26. | J2 short to gnd. | $-V_d$ | 0 |
| | 27. | CS1&2 closed, or J3&4 short to gnd. | nil | + |
| | 28. | CS3 closed or short to gnd. | nil | + | and $V_E >$ gnd. and $V_F >$ gnd. |
| | 29. | J1&2 short to gnd. or open between J1&2 and $V_s$ | nil | 0 | |

Wherein:

| | |
|---|---|
| $V_C$ | Voltage detected at the first junction 50 |
| $V_D$ | Voltage detected at the second junction 52 |
| $V_E$ | Voltage detected at the third junction 58 |
| $V_F$ | Voltage detected at the fourth junction 60 |
| $V_{CD}$ | $V_C$ minus $V_D$ |
| $V_{CE}$ | $V_C$ minus $V_E$ |
| $V_{DF}$ | $V_D$ minus $V_F$ |
| SS1 | Safing sensor 30 of first circuit leg 12 |
| SS2 | Safing sensor 38 of second circuit leg 14 |
| CS1 | Crash sensor 34 of first circuit leg 12 |
| CS2 | Crash sensor 42 of second circuit leg 14 |
| CS3 | Crash sensor 70 connected in parallel with first and second crash sensors 34 and 42 |
| J1-J5 | Junctions 50, 52, 58, and 60, 72 respectfully |
| "$V_d$" | The instantaneous forward-biased conduction voltage of diodes 48, 56, and 68 comprising diode bridges 46, 54, and 62 |
| "+" | An appreciable positive voltage |
| "−" | An appreciable negative voltage |
| "nil" | A voltage of negligible amplitude |
| "g" | A specified guard band, for example, 0.3 volts, to accommodate variation in the nominal resistance of circuit components and, thus, prevent inadvertent registering of faults when the circuit is fault free |

The following examples serve to illustrate application of the above diagnostic sequence, as well as illustrating the use of Table I. For each example, the supply voltage $V_s$ is 12 volts and, thus, the Ranges 1-5 as calculated under step (2) above are as follows: Range 1, 0.0 to 1.68 volts; Range 2, 1.68 to 4.00 volts; Range 3, 4.00 to 5.28 volts; Range 4, 5.28 to 8.88 volts; and Range 5, 8.88 to 12.0 volts. It is assumed, for the following examples, that the diode forward-biased conduction voltage $V_d$ has been found to be 0.70 volts.

EXAMPLE 1

The voltages at the first, second, third and fourth junctions 50, 52, 58, and 60 are determined to be 12.00, 12.00, 11.98, and 11.99 volts, respectively. Given the 12 volt supply voltage, the first junction potential $V_C$ falls within Range 5. Since the voltage drop $V_{CD}$ between the first and second junctions 50 and 52 is zero, initial reference to Table I using only $V_{CD}$ identifies the following possible fault conductions: both squibs 32 and 40 are open (fault no. 7); both safing sensors 30 and 38 are closed (fault no. 8); the first and second junctions 50 and 52 are both shorted to the positive terminal of the battery 18 (fault no. 9); the circuit legs 12 and 14 are open between the third junction 58 and ground, and between the fourth junction 60 and ground, respectively (fault no. 10); or both the third and the fourth junctions 58 and 60 of the firing circuit 10 are shorted to the positive terminal of the battery 18 (fault no. 11).

Further reference to Table I indicates that any further differentiation between the above faults requires examination of the voltage drop $V_{CE}$ between the first and third junctions 50 and 58. In the instant example, a small positive voltage drop $V_{CE}$ of 0.02 volts occurs between the first and third junctions 50 and 58, and thus fault nos. 7, 10, and 11 do not apply—fault no. 7 would have generated a voltage drop $V_{CE}$ therebetween equivalent to the supply voltage $V_s$ (i.e., 12 volts), and fault nos. 10 and 11 would both have generated like voltages at the junctions 50 and 58.

To further differentiate between fault nos. 8 and 9, the capacitor 20 is charged by turning on charging transistor 22. If such charging produces an increase in the voltage $V_C$ detected at the first junction 50, then reference to Table I indicates that both safing sensors 30 and 38 are closed (fault no. 8). If such charging fails to produce and increase in the voltage $V_C$ detected at the first junction 50, then the first and second junctions 50 and 52 are shorted to the battery 18 (fault no. 8).

Alternatively, the microprocessor 26 can compare the battery voltage $V_A$ with the voltage $V_C$ detected at the first junction 50. Specifically, where the first and second junctions 50 and 52 are not shorted to the battery 18, a voltage drop substantially equal to the forward-biased conduction voltage $V_d$ of voltage supply diode 28 appears between the battery 18 and the first junction 50. Where the battery voltage $V_A$ is substantially equal to the voltage detected at the first junction 50, the first and second junctions 50 and 52 are shorted to the battery 18, i.e., fault no. 8 is indicated.

It is noted that, where the voltage drops $V_{CE}$ and $V_{DF}$ are unavailable, as where the voltages at only the first and second junctions 50 and 52 are read by the microprocessor 26 due to cost minimization or component malfunction, the specific fault in this example cannot be identified. Rather, the fault may only be characterized as being within two groups of faults, namely, either in the group comprising fault nos. 7, 8, and 10, or in the group comprising fault nos. 9 and 11.

EXAMPLE 2

The voltage at the first, second, third and fourth junctions 50, 52, 58, and 60 are determined to be 11.98, 12.00, 11.28, and 11.30 volts, respectively. The first junction potential thus falls within Range 5. Initial reference to Table I using $V_{CD}$ indicates the following possible fault conditions: the first junction 50 is shorted to the positive terminal of the battery 18 (fault no. 1); the first safing sensor 30 is closed (fault no. 2); or the third junction 58 is shorted to the positive terminal of the battery 18 (fault no. 3). Further reference to Table I using the small negative voltage drop $V_{CE}$ present between the first and third junctions 50 and 58 indicates that the first junction 50 is shorted to the positive terminal of the battery 18 (fault no. 1).

EXAMPLE 3

The voltages at the first, second, third and fourth junctions 50, 52, 58, and 60 are determined to be 6.10, 6.10 6.06, and 6.07, respectively. The first junction potential thus falls within Range 3. Since the first and second junctions 50 and 52 are of equal voltage, there is no fault present within the circuit 10.

EXAMPLE 4

The voltages of the first, second, third and fourth junctions 50, 52, 58, and 60 are determined to be 5.97, 6.12, 5.93, and 6.10 volts, respectively. The first junction potential thus falls within Range 3. In as much as the voltage drop $V_{CD}$ of $-0.15$ volts between the first and second junctions 50 and 52 is significantly less than the diode forward-biased conduction voltage $V_d$, at least one of the shunting resistors 36 and 44 in the circuit 10 has a nominal resistance outside of the acceptable range therefor (fault no. 19).

It is noted that, by adding an additional diode (not shown) between the eighth junction 74 and ground, further differentiation between the alternate conditions within fault nos. 23, 25, and 27 may be made. More specifically, the second and fourth junctions 52 and 60 are not shorted to ground where the voltages thereof are equal to the forward-biased conduction voltage $V_d$ of such additional diodes. In contrast, a short to ground is indicated where the voltage of the second and fourth junctions 52 and 60 are zero. However, the presence of such additional diodes in the circuit legs 12 and 14 alters the above fault range percentages and, hence, the fault ranges applicable for circuit diagnosis, due to the forward-biased conduction voltage $V_d$ thereof.

It is further noted that the forward-biased conduction voltage $V_d$ of a given diode varies both as a result of manufacturing tolerances and the operating conditions to which the diode is exposed, e.g., variations in the operating temperature thereof. Thus, in order to accurately diagnose a fault within the firing circuit 10, the instantaneous forward-biased conduction voltage $V_d$ of each bridging diode 48, 56, and 68 is preferably periodically redetermined for use in the above diagnostic sequence. Accordingly, the firing circuit 10 of the instant invention further comprises means connected to the third, fourth, and seventh junctions 58, 60, and 72, respectively, operative to selectively draw current therefrom, such as the transistors 82, 84, and 86 illustrated in FIG. 1. More specifically, the collector of each transistor 82, 84, and 86 is connected to the third, fourth, and seventh junctions 58, 60, and 72, respectively, via a resistor 88 having a resistance substantially greater than that of the squibs 32 and 40, with the emitter of each transistor 82, 84, and 86 being connected to ground.

Figure 3:
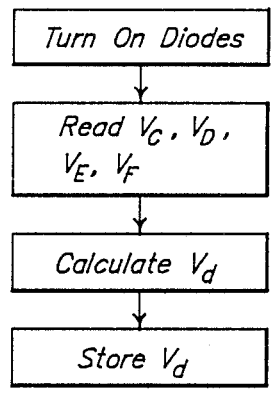
FIG. 3 is a flow chart illustrating a method for determining the instantaneous forward-biased conduction voltages of the diodes comprising the diode bridges of the air bag firing circuit of FIG. 1.

The method for determining the instantaneous forward-biased conduction voltages $V_d$ of the diodes 48, 56, and 68 comprising the diode bridges 46, 54, and 62 is illustrated in FIG. 3. Specifically, a current is supplied to the base of a transistor 82, 84, or 86 from the microprocessor 26, thereby drawing current through the resistor 88 connected to the collector thereof. An increased current thus flows through the circuit leg 12 to which the empowered transistor 82, 84, or 86 is connected which, in turn, results in a larger potential drop across the safing sensor 30 or 38 thereof to provide a voltage drop across the forwardly-biased diodes of each bridge 46, 54, or 62 sufficient to turn the diodes "on". The resultant voltage drops $V_{CE}$ and $V_{DF}$ between the first and second junctions 50 and 52, and the third and fourth junctions 58 and 60, respectively, equal the instantaneous values of the forward-biased conduction voltages of the diodes 48, 56, or 68. The instantaneous forward-biased conduction voltage $V_d$ of each diode 48, 56, and 68 is thereafter stored in the EEPROM 78 for use in the diagnostic sequence described hereinabove.

It is noted that a preselected value for the diode forward-biased conduction voltages $V_d$ is used if the instantaneous voltage drop across the diode cannot be calculated due to transistor or diode malfunction. In this regard, it is further noted that the diode forward-biased conduction voltages $V_d$ can be accurately checked only when there are no faults present in the firing circuit 10, or when the faults present fall within Range 3, as defined hereinabove. Thus, when testing for the instantaneous diode forward-biased conduction voltage $V_d$, if the voltage drop $V_{CD}$ calculated from the instantaneous voltages at the first and third junctions 50 and 58 is greater than zero but less than a minimum allowable value therefor, a transistor or diode fault is indicated (fault no. 20).

The instant diagnostic sequence may additionally comprise the steps of: reading the voltages $V_{CD}$, $V_{CE}$, $V_{DE}$, and $V_{EF}$ about the first circuit several times and calculating average values therefrom for use the steps outlined hereinabove; checking the integrity of the signal lamp 80 and empowering a back-up signal means in the event of a failure of the signal lamp 80; signaling the specific fault detected, as by a coded sequence, via the signal lamp 80; reading the voltage $V_B$ applied across the circuit legs 12 and 14, and charging the capacitor 20 if the applied voltage $V_B$ falls below the level sufficient to fire both squibs 30 and 38, as may occur, for example, upon malfunction of the battery 18 or the isolation of the battery 18 from the circuit 10 during a vehicle collision; and verifying the physical attachment of the acceleration sensors 30, 34, 38, 42, and 70 to the vehicle frame through the use of additional sensing means therefor (not shown).

Upon the determination of the presence of a fault within the circuit 10, the microprocessor 26 may incorporate means therein, such as incremental counters, for determining whether the indicated fault is a system aberration, such as a momentary closure of one of the safing sensors 30 and 38, or a true fault, such as a sensor which has failed in the closed position. The microprocessor 26 may further incorporate a deadman timer to ensure continued diagnostic capability therein, e.g., to cause the microprocessor 26 to begin at a specific point in the instructions therefor in the event that the microprocessor 26 is tied up by a random external disturbance. The microprocessor 26 instructions may further comprise steps for checking the integrity of the EEPROM 78 connected therewith, and for recording in the EEPROM 78 the purging of the faults recorded therein.

Figure 4:
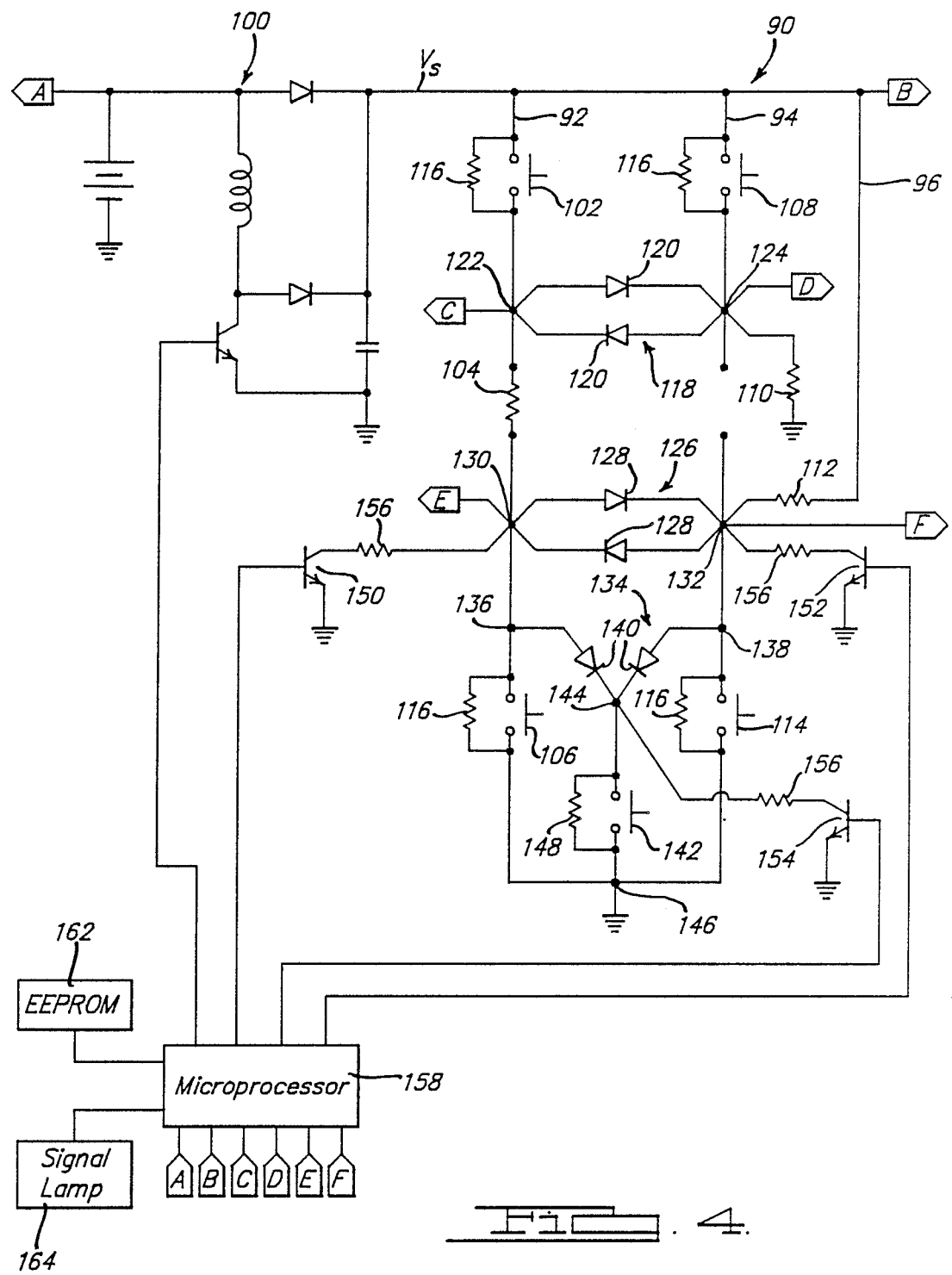
FIG. 4 is an alternate embodiment of the air bag firing circuit of the instant invention for deployment of but a single air bag.

An alternate embodiment 90 of the instant air bag firing circuit is illustrated in FIG. 4. The firing circuit 90 actuates a single air bag, such as a driver's side air bag (not shown), while providing multiple firing paths and full circuit diagnosability. Specifically, the firing circuit 90 comprises three circuit legs 92, 94, and 96 connected in parallel across a voltage supply 100 similar to that described hereinabove with respect to the first embodiment 10 of the instant firing circuit.

The first leg 92 comprises in series a first safing sensor 102, a squib 104 for actuating the air bag, and a first crash sensor 106; the second leg 94 comprises in series a second safing sensor 108 and a resistor 110; and the third leg 96 comprises in series a resistor 112 and a second crash sensor 114. As in the first embodiment 10, each sensor 102, 106, 108, and 114 is provided with a shunting resistor 116 of like nominal resistance as series resistors 110 and 112 of the second and third legs 94 and 96, respectively.

A first diode bridge 118 comprised of oppositely-biased diodes 120 connects a junction 122 on the first leg 92 between safing sensor 102 and squib 104 (hereinafter "first junction 122") with a junction 124 on the second leg 94 between safing sensor 108 and resistor 110 (hereinafter "second junction 124"). A second diode bridge 126 comprising oppositely-biased diodes 128 connects another junction 130 on the first circuit leg 92 between squib 104 and crash sensor 106 (hereinafter "third junction 130") with a junction 132 on the third circuit leg 96 between resistor 112 and crash sensor 114 thereof (hereinafter "fourth junction 132"). A third diode bridge 134 connects another junction 136 on the first circuit leg 92 between squib 104 and crash sensor 106 (hereinafter "fifth junction 136") with another junction 138 on the third circuit leg 96 between resistor 112 and crash sensor 114 (hereinafter the "sixth junction 138"). As in the first embodiment 10, the third diode bridge 134 of the second embodiment 90 comprises a pair of oppositely-biased diodes 140 connected in series with the cathodes thereof in opposition.

A third crash sensor 142 connects a junction 144 on the third diode bridge 134 between the diodes 140 thereof (hereinafter "seventh junction 144") with the first and third circuit legs 92 and 96, respectively, at the junction 146 therebetween (hereinafter "eighth junction 146") so as to be placed in parallel with the first and second crash sensors 106 and 114. The third crash sensor 142 is shunted by a resistor 148 having a nominal resistance similar to that of the resistors 116 shunting the first and second crash sensors 106 and 114.

As in the first embodiment 10 of the instant firing circuit, the collector of a transistor 150, 152, and 154 is connected to the third, fourth, and seventh junctions 130, 132, and 144 of firing circuit 90, respectively, via a resistor 156 to provide a means for selectively drawing current therefrom under the control of microprocessor 158. The microprocessor 158 is similarly connected to the pumping transistor 160 of the power supply 100, EEPROM 162, and signal lamp 164, each of which operate in the same manner as has been heretofore described with regard to the first embodiment 10 of the instant firing circuit.

It is noted that the splitting of the second circuit leg 14 of the first embodiment 10 of the instant firing circuit as shown in FIG. 1 into two separate circuit legs 92 and 94, as in the second embodiment 90 shown in FIG. 4, is necessitated by the fact that the second squib 40 of the first embodiment 10 cannot simply be replaced by a resistor of like nominal resistance upon the removal of the second squib 40 therefrom, as a resistor of such low nominal resistance would catastrophically fail upon the closing of a crash and safing sensor, with the attendant risk of fire or other hazard as well as lowered circuit reliability.

As in the first embodiment 10 of the instant firing circuit, the diode bridges 118, 126, and 134 of firing circuit 90 enable either of the safing sensors 102 and 108 thereof to "arm" all of its crash sensors 106, 114, and 142. Thus, upon the simultaneous closure of either safing sensor 102 and 108 and any crash sensors 106, 114, and 142, the current flowing through the squib 104 in the first circuit leg 92 is increased to a value above the firing threshold thereof, whereupon the squib 104 deploys the air bag. The diode bridges 118, 126, and 134 similarly provide full circuit diagnosability using the diagnostic sequence described hereinabove with respect to the first embodiment 10 of the instant firing circuit.

While the preferred embodiments of the invention have been disclosed, it should be appreciated that the invention is susceptible of modification without departing from the scope of the following claims.

We claim:

1. In a firing circuit for actuating a first and second vehicle passenger restraint comprising a first circuit leg comprising in series a first normally-open acceleration sensor, a first trigger means having an internal resistance for actuating said first restraint, and a second normally-open acceleration sensor being shunted by a first second sensor, said first and and second resistor, respectively, said first and second shunting resistors having a resistance substantially greater than the internal resistance of said first trigger means;

a second circuit leg connected in parallel with said first circuit leg comprising in series a third normally-open acceleration sensor, a second trigger means for actuating said second restraint having an internal resistance substantially equal to the internal resistance of said first trigger means, and a fourth normally-open acceleration sensor, said third and fourth sensor being shunted by a third and fourth resistor, respectively, said third and fourth shunting resistors having a resistance substantially greater than the internal resistance of said second trigger means;

a first diode bridge comprising a pair of oppositely biased diodes connecting a first junction on said first circuit leg between said first sensor and said first trigger means with a first junction on said second circuit leg between said third sensor and said second trigger means;

a second diode bridge comprising a pair of oppositely biased diodes connecting a second junction on said first circuit leg between said first trigger means and said second sensor with a second junction on said second circuit leg between said second trigger means and said fourth sensor; and means for applying a first voltage across said circuit legs;

the improvement comprising a third diode bridge connecting a third junction on said first circuit leg between said first trigger means and said second sensor with a third junction on said second circuit leg between said second trigger means and said fourth sensor, said third bridge comprising a pair of oppositely-biased diodes connected in series with the cathodes thereof in opposition; and a fifth sensor connecting a junction on said third bridge between the diodes thereof with said first and second circuit legs so as to be placed in parallel with said second and fourth sensors thereof, respectively, said fifth sensor being shunted by a fifth resistor having a resistance substantially greater than the internal resistance of said first trigger means.

2. The firing circuit of claim 1 including means for diagnosing a fault in said firing circuit comprising means for reading the voltage applied across said circuit legs;

means for calculating a plurality of voltage ranges from the applied voltage and a plurality of known percentages of the applied voltage;

means for reading the voltages at a plurality of said junctions;

means for comparing the voltage at one of said junctions with said voltage ranges; and means for comparing the voltage at one of said junctions with the voltage at another of said junctions.

3. The firing circuit of claim 2 wherein said fault diagnosing means further comprises means connected to said junction on said third bridge operative to draw current therefrom; and means for comparing the voltages at said second junctions of said first and second circuit legs, respectively, before current is drawn from said junction on said third bridge with the voltages at said second junctions of said first and second circuit legs, respectively, when current is being drawn from said junction on said third bridge.

4. The firing circuit of claim 3 wherein said means connected to said junction on said third bridge operative to draw current therefrom comprises a transistor, the collector of said transistor being connected to said junction through a sixth resistor having a resistance substantially greater than the internal resistance of said trigger means, the emitter of said transistor being connected to location on said circuit having a zero voltage; and means responsive to said fault diagnosing means operative to deliver a current to the base of said transistor.

5. The firing circuit of claim 1 wherein the thresholds of said second, fourth and fifth sensors, respectively, are significantly greater than the thresholds of said first and third sensors, respectively.

6. In a firing circuit for actuating a vehicle passenger restraint comprising a first circuit leg comprising in series a first normally-open acceleration sensor, trigger means having an internal resistance for actuating said restraint, and a second normally-open acceleration sensor, said first and second sensor being shunted by a first and second resistor, respectively, said first and second resistors having a resistance substantially greater than the internal resistance of said trigger means;

a second circuit leg connected in parallel with said first circuit leg comprising in series a third normally-open acceleration sensor and a third resistor having a resistance substantially greater than the internal resistance of said trigger means, said third sensor being shunted by a fourth resistor having a resistance substantially greater than the internal resistance of said trigger means;

a third circuit leg connected in parallel with said first and second circuit legs comprising in series a fifth resistor and a fourth normally-open acceleration sensor, said fifth resistor having a resistance substantially greater than the resistance of said trigger means, said fourth sensor being shunted by a sixth resistor having a resistance substantially greater than the internal resistance of said trigger means;

a first diode bridge comprising a pair of oppositely biased diodes connecting a first junction on said first circuit leg between said first sensor and said trigger means with a junction on said second circuit leg between said third sensor and said third resistor; and a second diode bridge comprising a pair of oppositely biased diodes connecting a second junction on said first circuit leg between sensor thereof with a first junction on said third circuit leg between said fifth resistor and said fourth sensor; and means for applying a first voltage across said circuit legs;

the improvement comprising a third diode bridge connecting a third junction on said first circuit leg between said first trigger means and said second sensor with a second junction on said third circuit leg between said fifth resistor and said fourth sensor, said third bridge comprising a pair of oppositely-biased diodes connected in series with the cathodes thereof in opposition; and a fifth sensor connecting a junction on said third bridge between the diodes thereof with said first and third circuit legs so as to be placed in parallel with said second and fourth sensors thereof, respectively, said fifth sensor being shunted by a seventh resistor having a resistance substantially greater than the internal resistance of said first trigger means.

7. The firing circuit of claim 6 including means for diagnosing a fault in said firing circuit comprising means for reading the voltage applied across said circuit legs;

means for calculating a plurality of voltage ranges from the applied voltage and a plurality of known percentages of the applied voltage;

means for reading the voltages at a plurality of said junctions;

means for comparing the voltage at one of said junctions with said voltage ranges; and means for comparing the voltage at one of said junctions with the voltage at another of said junctions.

8. The firing circuit of claim 7 wherein said fault diagnosing means further comprises means connected to said junction on said third bridge operative to draw current therefrom; and means for comparing the voltages at said second junctions of said first and second circuit legs, respectively, before current is drawn from said junction on said third bridge with the voltages at said second junctions of said first and second circuit legs, respectively, when current is being drawn from said junction on said third bridge.

9. The firing circuit of claim 8 wherein said means connected to said junction on said third bridge operative to draw current therefrom comprises a transistor, the collector of said transistor being connected to said junction through an eighth resistor having a resistance substantially greater than the internal resistance of said trigger means, the emitter of said transistor being connected to location on said circuit having a zero voltage; and means responsive to said fault diagnosing means operative to deliver a current to the base of said transistor.

10. The firing circuit of claim 6 wherein the thresholds of said second, fourth and fifth sensors, respectively, are significantly greater than the thresholds of said first and third sensors, respectively.

* * * * *

UNITED STATES PATENT AND TRADEMARK OFFICE
CERTIFICATE OF CORRECTION

PATENT NO. : 4,980,573

DATED : December 25, 1990

INVENTOR(S) : Craig W. White and Kevin E. Musser

It is certified that error appears in the above-identified patent and that said Letters Patent is hereby corrected as shown below:

On the title page:
  [57] ABSTRACT, the inventors name "Kevin E. Messer" should be --Kevin E. Musser--

Col. 3, line 24, after "thereby" insert a period(.)

Col. 7, Table I, Item No. 25, the "+" shoudl be in the next column to the right, under $V_{DF}$ Col. 8, line 63, "conductions" should be --conditions--;

Col. 13, line 14, after "sensor" (first occurrence), insert --, said first and second sensor-- and after "a" delete "first second sensor, said"

Col. 13, line 15, after "first" delete "and" (second occurrence)

Col. 14, line 68, after "between" insert --said first trigger means and said second--

Signed and Sealed this

Thirtieth Day of June, 1992

*Attest:*

DOUGLAS B. COMER

*Attesting Officer*      *Acting Commissioner of Patents and Trademarks*